(12) United States Patent
Tanaka

(10) Patent No.: US 9,500,712 B2
(45) Date of Patent: Nov. 22, 2016

(54) BATTERY VOLTAGE MONITOR CIRCUIT

(71) Applicant: Hidenori Tanaka, Tokyo (JP)

(72) Inventor: Hidenori Tanaka, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 484 days.

(21) Appl. No.: 13/775,417

(22) Filed: Feb. 25, 2013

(65) Prior Publication Data

US 2013/0234720 A1 Sep. 12, 2013

(30) Foreign Application Priority Data

Mar. 7, 2012 (JP) .................................. 2012-050374

(51) Int. Cl.
*G01R 31/36* (2006.01)
*G01R 19/25* (2006.01)
*H02J 7/00* (2006.01)

(52) U.S. Cl.
CPC ....... *G01R 31/3606* (2013.01); *G01R 19/2503* (2013.01); *G01R 31/362* (2013.01); *H02J 7/0019* (2013.01); *H02J 7/0021* (2013.01); *Y02T 10/7055* (2013.01)

(58) Field of Classification Search
CPC .................................................. G01R 31/362
USPC ....................................................... 324/434
See application file for complete search history.

(56) References Cited

U.S. PATENT DOCUMENTS

2008/0284375 A1 11/2008 Nagaoka et al.
2009/0198399 A1 8/2009 Kubo et al.
2010/0072604 A1* 3/2010 Komatsu et al. ............. 257/691
2010/0244847 A1* 9/2010 Kudo et al. .................... 324/433
2011/0050237 A1* 3/2011 Sekizaki et al. .............. 324/434
2011/0057658 A1 3/2011 Yugou et al.
2011/0074435 A1* 3/2011 Mizoguchi .................... 324/433
2011/0156714 A1* 6/2011 Mizoguchi et al. .......... 324/434
2011/0215810 A1* 9/2011 Murakami .................... 324/426
2012/0044010 A1* 2/2012 Murakami .................... 327/333
2012/0127671 A1 5/2012 Chen et al.

FOREIGN PATENT DOCUMENTS

JP 2000-162249 6/2000
JP 2001-177998 6/2001

(Continued)

OTHER PUBLICATIONS

Japanese Office Action mailed Dec. 22, 2015.

*Primary Examiner* — Edward Tso
*Assistant Examiner* — Jerry D Robbins
(74) *Attorney, Agent, or Firm* — IPUSA, PLLC

(57) ABSTRACT

A battery voltage monitor circuit for monitoring a voltage of plural secondary batteries includes first and second logic circuit parts that select first and second secondary batteries from the plural secondary batteries according to first and second command signals supplied from an external device, first and second reference voltage generation parts that generate first and second reference voltages, first and second AD conversion parts that digitalize a voltage of both ends of the first and second secondary batteries into first and second digital signals by using the first and second reference voltages, first and second communication parts that transmit the first and second digital signals to the external device.

4 Claims, 3 Drawing Sheets

(56) References Cited

FOREIGN PATENT DOCUMENTS

| JP | 2003-068525 | 3/2003 |
| JP | 2009-183025 | 8/2009 |
| JP | 3166059 U | 2/2011 |
| JP | 2011-058851 | 3/2011 |
| JP | 2011-191075 | 9/2011 |
| JP | 2011-217606 | 10/2011 |
| JP | 2012-044768 | 3/2012 |

* cited by examiner

BATTERY VOLTAGE MONITOR CIRCUIT

BACKGROUND OF THE INVENTION

1. Field of the Invention

The present invention generally relates to a battery voltage monitor circuit, such as a battery voltage monitor circuit for monitoring voltages of multiple secondary batteries connected in series.

2. Description of the Related Art

In recent years, a secondary battery (e.g., lithium ion battery) is used as a power source mounted on a vehicle such as an electric-powered bicycle or an automobile. The lithium ion battery is to be equipped with a monitor circuit for monitoring the voltage of the lithium ion battery. In a case of using a single battery pack having multiple lithium ion batteries connected in series, the monitor circuit accurately measures the voltage of each of the multiple lithium ion batteries and notifies the measurement result to an upper level device such as an external CPU (Central Processing Unit).

A protection apparatus and a condenser of a module battery having multiple secondary batteries connected in series according to a related art example (see, for example, Japanese Laid-Open Patent Publication No. 2001-177998) includes a first protection unit that detects a voltage between terminals of the secondary batteries and outputs a signal to stop the charging/discharging of the module battery in a case where the detected voltage of the terminals of the secondary batteries is beyond a predetermined range, and a second protection unit that detects a voltage between terminals of the module battery and outputs a signal to stop the charging/discharging of the module battery in a case where the detected voltage of the terminals of the module battery is beyond a predetermined range.

Although battery voltage monitor circuits that monitor the voltage of a battery pack are expected to have high reliability, the reliability of the battery voltage monitor circuits may be degraded by harsh environmental usage conditions (e.g., temperature, vibration) in a case where the battery pack is mounted on a vehicle.

As one method for improving reliability of the battery voltage monitor circuits under a harsh environmental usage conditions, there is a method of dualizing the battery voltage monitor circuit mounted on the battery pack. However, this dualizing method has a problem of doubling the cost of the battery voltage monitor circuit.

SUMMARY OF THE INVENTION

The present invention may provide a battery voltage monitor circuit that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a battery voltage monitor circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a battery voltage monitor circuit for monitoring a voltage of a plurality of secondary batteries, the battery voltage monitor circuit including: a first logic circuit part that selects a first secondary battery from the plural secondary batteries according to a first command signal supplied from an external device; a first reference voltage generation part that generates a first reference voltage; a first AD conversion part that digitalizes a voltage of both ends of the first secondary battery into a first digital signal by using the first reference voltage; a first communication part that transmits the first digital signal to the external device; a second logic part that selects a second secondary battery from the plural secondary batteries according to a second command signal supplied from the external device; a second reference voltage generation part that generates a second reference voltage; a second AD conversion part that digitalizes a voltage of both ends of the second secondary battery into a second digital signal by referring to the second reference voltage; and a second communication part that transmits the second digital signal to the external device.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

<Circuit Configuration of Battery Voltage Monitor Circuit>

Figure 1:
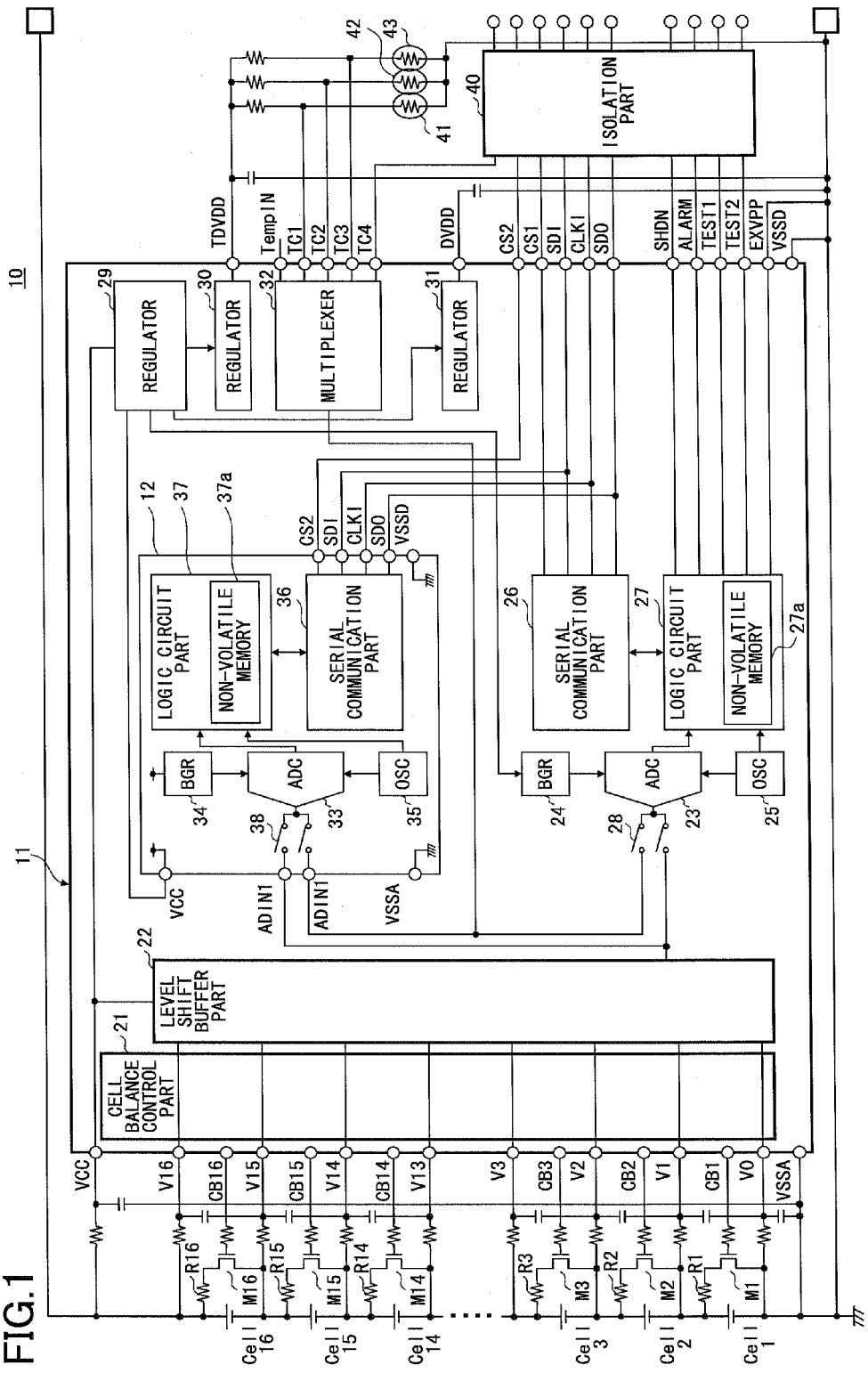
FIG. 1 is a schematic diagram illustrating a configuration of a battery voltage monitor circuit according to an embodiment of the present invention.

FIG. 1 is a schematic diagram illustrating a configuration of a battery voltage monitor circuit 10 according to an embodiment of the present invention. In FIG. 1, the battery voltage monitor circuit 10 includes a semiconductor chip 11 and another semiconductor chip 12. The semiconductor chip 11 and the semiconductor chip 12 are manufactured in separated processes.

The semiconductor chip 11 includes, a cell balance control part 21, a level shift buffer part 22, an AD converter (Analog/Digital Converter (ADC)) 23, a band gap reference voltage generation part (BGR) 24, an oscillation part (OSC) 25, a serial communication part 26, a logic circuit part 27, a switch 28, and regulators 29, 30, 31, and a multiplexer 32.

The semiconductor chip 12 includes an AD converter 33, a band gap reference voltage generation part 34, an oscillation part 35, a serial communication part 36, a logic circuit part 37, and a switch 38. The AD converter 33 has the same circuit configuration as the AD converter 23; The band gap reference voltage generation part 34 has the same circuit configuration as the band gap reference voltage generation part 24; the oscillation part 35 has the same circuit configuration as the oscillation part 25; the serial communication part 36 has the same circuit configuration as the serial communication part 26; the logic circuit part 37 has the same circuit configuration as the logic circuit part 27; and the switch 38 has the same circuit configuration as the switch 28.

The cell balance control part 21 switches on one of the n-channel MOS transistors M1-M16 by outputting a high level signal to one of the external terminals CB1 to CB16 of the semiconductor chip 11 in accordance with control signals from the logic circuit part 27, 37. In a case where one of the MOS transistors M1 to M16 is switched on, both ends of one of the battery cells Cell 1 to Cell 16 are connected by way of limiting resistors R1 to R16, and the battery cells Cell 1 to Cell 16 are discharged. Thereby, a cell balancing process can be performed in which the voltage of each of the battery cells Cell 1 to Cell 16 becomes constant.

It is to be noted that each of the battery cells Cell 1 to Cell 16 connected in series is a lithium ion battery according to an embodiment of the present invention. Both ends of the battery cell Cell 1 are connected to corresponding external terminals V0, V1 by way of a protection resistor, and both ends of the battery cell Cell 2 are connected to corresponding terminals V1, V2. Likewise, both ends of the subsequent battery cells are connected in the similar manner as described above. Lastly, both ends of the battery cells Cell 16 are connected to corresponding external terminals V15, V16 by way of a protection resistor.

In a case where control signals from the logic circuit parts 27, 37 instruct selection of the battery cell Cell 1, the level shift buffer part 22 outputs the voltage of the external terminal V1 to the switches 28, 38 in a state where the voltage of the external terminal V0 has shifted to ground level. In a case where control signals from the logic circuit parts 27, 37 instruct selection of the battery cell Cell 2, the level shift buffer part 22 outputs the voltage of the external terminal V2 to the switches 28, 38 in a state where the voltage of the external terminal V1 has shifted to ground level. Likewise, in a case where control signals from the logic circuit parts 27, 37 instruct selection of the subsequent battery cells, the level shift buffer part 22 to outputs voltages in the similar manner as described above. Lastly, in a case where control signals from the logic circuit part 27, 37 instruct selection of the battery cell Cell 16, the level shift buffer part 22 outputs the voltage of the external terminal V16 to the switches 28, 38 in a state where the voltage of the external terminal V15 has shifted to ground level.

The switch 28 supplies an output voltage of the level shift buffer part 22 to the AD converter 23 when a control signal from the logic circuit part 27 instructs that the battery voltage be measured (battery voltage measurement). The switch 28 supplies an output voltage of the multiplexer 32 to the AD converter 23 when a control signal from the logic circuit part 27 instructs temperature be measured or self-diagnosis be performed. The band gap reference voltage generation part 24 generates a reference voltage by using a band gap circuit and supplies the reference voltage to the AD converter 23. The oscillation part 25 generates a clock and supplies the clock to the AD converter 23, the serial communication part 26, and the logic circuit part 27.

The AD converter 23 digitalizes the output voltage of the level shift buffer part 22 (i.e. battery voltage) or the output voltage of the multiplexer 32 (temperature or test voltage) and supplies, the digitalized output voltage to the logic circuit part 27.

The logic circuit part 27 is connected to an external device (e.g., external CPU (not illustrated)) interposed by external terminals SHDN, ALARM, TEST1, TEST2, and an isolation part 40. The logic circuit part 27 interprets the control commands (command signals) supplied from the external CPU and supplies control signals to each part of the semiconductor chip 11 according to the interpretation of the command signals. Further, the logic circuit part 27 supplies chip selection signals (supplied from the external CPU (not illustrated)) to the external terminal CS1 by way of the serial communication part 26. The logic circuit part 27 supplies digital measured battery voltage signals (digital signals indicating measured battery voltage) from the AD converter 23 to the serial communication part 26 when measuring battery voltage. The logic circuit part 27 supplies digital measured temperature signals (digital signals indicating measured temperature) to the serial communication part 26 when measuring temperature. It is to be noted that the isolation part 40 performs level shift of signals communicated (transmitted/received) between the battery voltage monitor circuit 10 and the external CPU.

Further, the logic circuit part 27 includes a non-volatile memory 27a in which various reference values are recorded beforehand. The reference values include, for example, a reference voltage output from the band gap reference voltage generation part 24 during a normal state, a test voltage applied to the external terminal TC4 by way of the isolation part 40 during self-diagnosis. The logic circuit part 27 determines whether the AD converter 23 or the band gap reference voltage generation part 24 is operating normally or whether there is a failure by comparing the reference voltage output from the band gap reference voltage generation part 24 or the test voltage applied to the external terminal TC4 with respect to the reference values stored in the non-volatile memory 27a during self-diagnosis. In a case where there is a failure, an alarm signal is supplied from the external terminal ALARM to an external CPU.

The serial communication part 26 supplies the digital measured battery voltage signals or the digital measured temperature signals (which are supplied from the AD converter 23 by way of the logic circuit part 27) together with clock signals to an external CPU by way of external terminals SD0, SD1, CLK1 and the isolation part 40. It is to be noted that the serial communication part 26 outputs the above-described digital signals in a case where, for example, a high level chip selection signal is supplied from an external CPU by way of the external terminal CS1.

The regulator 29 generates a direct current voltage (e.g., 4.5 V) by using a voltage supplied from the battery cells Cell 1 to Cell 16 connected in series and supplies the generated direct current voltage to the band gap reference voltage generation part 24 of the semiconductor chip 11 and the band gap reference voltage generation part 34 of the semiconductor chip 12. The regulator 30 generates a direct current voltage (e.g., 3.3 V) by using a direct current voltage of, for example, 4.5 V and supplies the generated direct current voltage from an external terminal TDVDD to external thermistors 41, 42, 43.

The regulator 31 generates a direct current voltage (e.g., 3.3 V) by using a direct current voltage of, for example, 4.5 V and supplies the generated direct current voltage to the AD converter 23, the oscillation part 25, the serial communication part 26, the logic circuit part 27, the multiplexer 32, the AD converter 33, the oscillation part 35, the serial communication part 36, and the logic circuit part 37.

The multiplexer 32 selects one of the output voltage of the thermistors 41, 42, 43 supplied from the external terminals TC1, TC2, TC3, the test voltage supplied from, for example, an external CPU to the external terminal TC4, and the voltage supplied from an externally attached multiplexer (not illustrated) to the external terminal TempIN, and supplies the selected voltage to the switches 28, 38.

The switch 38 supplies an output voltage of the level shift buffer part 22 to the AD converter 33 when a control signal from the logic circuit part 37 instructs that the battery voltage be measured (battery voltage measurement). The switch 38 supplies an output voltage of the multiplexer 32 to the AD converter 33 when a control signal from the logic circuit part 37 instructs temperature be measured or self-diagnosis be performed. The band gap reference voltage generation part 34 generates a reference voltage by using a band gap circuit and supplies the reference voltage to the AD converter 33. The oscillation part 35 generates a clock and supplies the clock to the AD converter 33, the serial communication part 36, and the logic circuit part 37.

The AD converter 33 digitalizes the output voltage of the level shift buffer part 22 (i.e. battery voltage) or the output voltage of the multiplexer 32 (temperature or test voltage) and supplies the digitalized output voltage to the logic circuit part 37.

The logic circuit part 37 is connected to an external CPU (not illustrated) interposed by external terminals SHDN, ALARM, TEST1, TEST2, and the isolation part 40. The logic circuit part 37 interprets the control commands supplied from the external CPU and supplies control signals to each part of the semiconductor chip 12 according to the interpretation. Further, the logic circuit part 37 supplies chip selection signals (supplied from the external CPU (not illustrated)) to the external terminal CS2 by way of the serial communication part 36. The logic circuit part 37 supplies digital measured battery voltage signals (digital signals indicating measured battery voltage) from the AD converter 33 to the serial communication part 36 when measuring battery voltage. The logic circuit part 37 supplies digital measured temperature signals (digital signals indicating measured temperature) to the serial communication part 36 when measuring temperature.

Further, the logic circuit part 37 includes a non-volatile memory 37a in which various reference values are recorded beforehand. The reference values include, for example, a reference voltage output from the band gap reference voltage generation part 34 during a normal state, a test voltage applied to the external terminal TC4 by way of the isolation part 40 during self-diagnosis. The logic circuit part 37 determines whether the AD converter 33 or the band gap reference voltage generation part 34 is operating normally or whether there is a failure by comparing the reference voltage output from the band gap reference voltage generation part 34 or the test voltage applied to the external terminal TC4 with respect to the reference values stored in the non-volatile memory 37a during self-diagnosis. In a case where there is a failure, an alarm signal is supplied from the external terminal ALARM to an external CPU.

The serial communication part 36 supplies the digital measured battery voltage signals or the digital measured temperature signals (which are supplied from the AD converter 33 by way of the logic circuit part 37) together with clock signals to an external CPU by way of external terminals SD0, SD1, CLK1 and the isolation part 40. It is to be noted that the serial communication part 36 outputs the above-described digital signals in a case where, for example, a high level chip selection signal is supplied from an external CPU by way of the external terminal CS2.

<Operation Mode of Battery Voltage Monitor Circuit>

The battery voltage monitor circuit 10 activates the regulators 29 to 31 and goes into a standby mode when, for example, a high level signal is supplied from an external CPU to an external terminal SHDN. Then, when a high level chip selection signal is supplied to the external terminal CS1 or the external terminal CS2, the battery voltage monitor circuit 10 becomes an active mode. Thereby, the battery voltage monitor circuit 10 performs voltage measurement by using the AD converter 23 or the AD converter 33 and outputs digital signals indicating the results of the voltage measurement by using the serial communication part 26 or the serial communication part 36. Then, when a low level chip selection signal is supplied to the external terminal CS1 or the external terminal CS2, the battery voltage monitor circuit 10 becomes a standby mode. Further, the battery voltage monitor circuit 10 stops (shuts down) all components including the regulators 29 to 31 when a low level signal is supplied to the external terminal SHDN.

<Flowchart>

Figure 2:
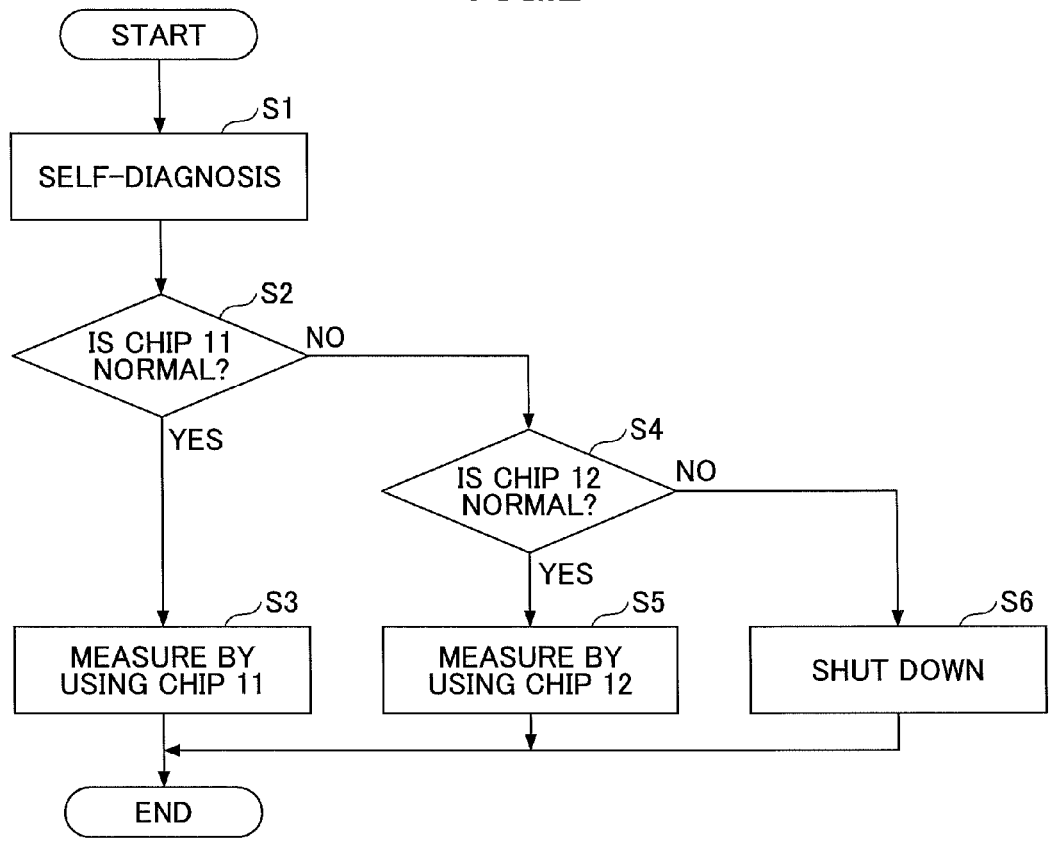
FIG. 2 is a flowchart illustrating an operation performed by a battery voltage monitor circuit according to an embodiment of the present invention in a case where the battery voltage monitor circuit changes from a standby mode to an active mode according to an instruction from an external CPU.

FIG. 2 is a flowchart illustrating an operation performed by the battery voltage monitor circuit 10 according to an instruction from an external CPU in a case where the battery voltage monitor circuit 10 changes from a standby mode to an active mode. In Step S1, each of the logic circuit parts 27, 37 performs self-diagnosis according to an instruction from the external CPU. For example, the logic circuit parts 27, 37 determine whether the AD converters 23, 33 and/or the band gap reference voltage generation parts 24, 34 are operating normally by comparing the reference values stored in the non-volatile memory 27a, 37a with respect to, for example, the reference voltages output by the band gap reference voltage generation parts 24, 34 and/or the test voltage applied to the external terminal TC4. In a case where the logic circuit parts 27, 37 determine that the AD converters 23, 33 and/or the band gap reference voltage generation parts 24, 34 are not operating normally (failure), the external terminal ALARM supplies an alarm signal to the external CPU.

In Step S2, the external CPU determines whether the AD converter 23 and the band gap reference voltage generation part 24 of the semiconductor chip 11 are operating normally. In a case where the AD converter 23 and the band gap reference voltage generation part 24 of the semiconductor chip 11 are determined as operating normally (Yes in Step S2), the battery voltage monitor circuit 10 is switched to an active mode by supplying a high level chip selection signal from the external CPU to only the external terminal CS1. Thereby, the battery voltage monitor circuit 10 outputs a digital measured battery voltage or a digital measured temperature by using the AD converter 23, the band gap reference voltage generation part (BGR) 24, the oscillation part (OSC) 25, the serial communication part 26, the logic circuit part 27, and the switch 28.

On the other hand, in a case where the AD converter 23 and the band gap reference voltage generation part 24 of the semiconductor chip 11 are determined as not operating normally (determined as failure) (No in Step S2), the external CPU determines whether the AD converter 33 and the band gap reference voltage generation part 34 of the semiconductor chip 12 are operating normally in Step S4. In a case where the AD converter 33 and the band gap reference voltage generation part 34 of the semiconductor chip 12 are determined as operating normally (Yes in Step S4), the battery voltage monitor circuit 10 is switched to an active mode by supplying a high level chip selection signal from the external CPU to only the external terminal CS2. Thereby, the battery voltage monitor circuit 10 outputs a digital measured battery voltage or a digital measured temperature by using the AD converter 33, the band gap reference voltage generation part (BGR) 34, the oscillation part (OSC) 35, the serial communication part 36, the logic circuit part 37, and the switch 38.

In a case where the AD converter 33 and the band gap reference voltage generation part 34 of the semiconductor chip 12 are determined as not operating normally (determined as failure) (No in Step S4), the external CPU shuts down the battery voltage monitor circuit 10 by supplying a low level signal to the external terminal SHDN in Step S6.

In this embodiment, the cell balance control part 21 and the level shift buffer part 22 of the semiconductor chip 11 are high voltage resistant circuit whereas the AD converter 23, the band gap reference voltage generation part (BGR) 24, the oscillation part (OSC) 25, the serial communication part 26, the logic circuit part 27, the switch 28, and the regulators 29, 30, 31, and the multiplexer 32 are low pressure resistant circuits. A high voltage resistant circuit has a large chip area and includes a small number of devices (e.g., approximately several hundreds of devices). A low voltage resistant circuit has a small chip area and includes a large number of devices (e.g., approximately several ten thousands of devices) compared to the high voltage resistant circuit. Therefore, the possibility of failure occurring in the low voltage resistant circuit is significantly higher than the possibility of failure occurring in the high voltage resistant circuit.

Therefore, in this embodiment, the battery voltage monitor circuit 10 is provided with the semiconductor chip 12 including the AD converter 33, the band gap reference voltage generation part 34, the oscillation part 35, the serial communication part 36, the logic circuit part 37, and the switch 38 that have substantially the same configurations as those of the main components of the low voltage resistant circuit of the semiconductor chip 11 (i.e. the AD converter 23, the band gap reference voltage generation part 24, the oscillation part 25, the serial communication part 26, the logic circuit part 27, and the switch part 28). Further, by providing a self-diagnosis function to the logic circuit parts 27, 37, the semiconductor chip 12 can be used in a case where the logic circuit parts 27, 37 determines a failure occurring in the AD converter 23 or the band gap reference voltage generation part 24. Thereby, reliability of the battery voltage monitor circuit 10 can be improved. Because the semiconductor chip 12 is inexpensive compared to the semiconductor chip 11, cost of the battery voltage monitor circuit 10 can be kept at a low cost.

<Cross Section of Battery Voltage Monitor Circuit>

Figure 3:
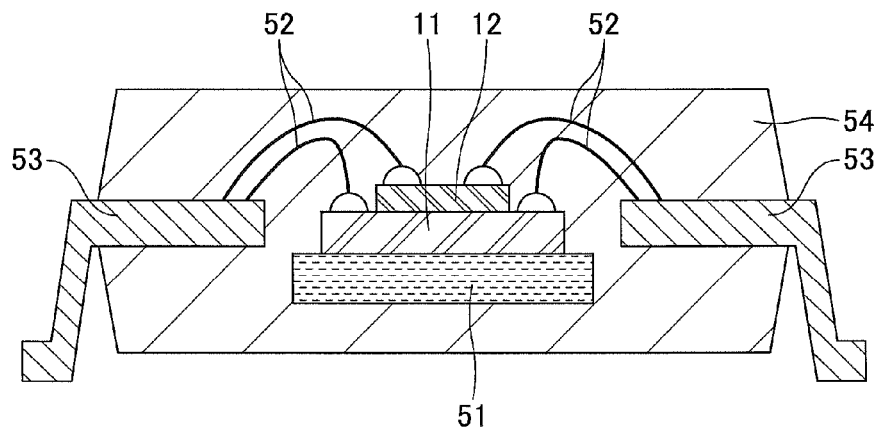
FIG. 3 is a cross-sectional view of a batter voltage monitor circuit according to an embodiment of the present invention.

FIG. 3 is a cross-sectional view of the batter voltage monitor circuit according to an embodiment of the present invention. In FIG. 3, the semiconductor chip 11 is fixed onto a stage 51. The semiconductor chip 12 is arranged (layered) on top of the semiconductor chip 11 and fixed to the semiconductor chip 11 by using an insulating adhesive agent. The external terminals of the semiconductor chips 11, 12 are connected to leads 53 with wires 52. The stage 51, the semiconductor chips 11, 12, the wires 52, and the leads 53 are encapsulated by an encapsulating material (e.g., encapsulating resin) 54 except for a portion of the leads 53.

Figure 4:
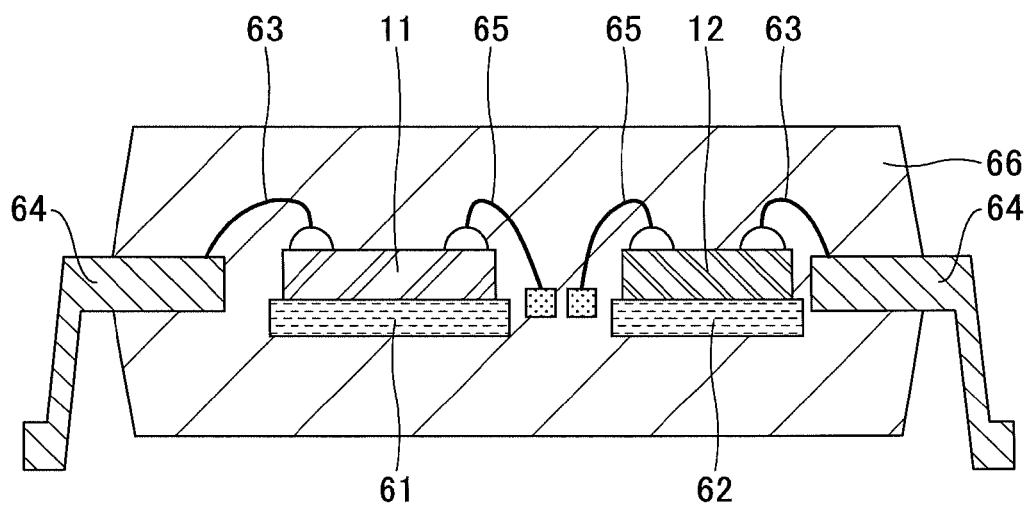
FIG. 4 is a cross-sectional view of a batter voltage monitor circuit according to another embodiment of the present invention.

Alternatively, the semiconductor chip 11 and the semiconductor chip 12 may be formed on a same plane as illustrated in FIG. 4 instead of being arranged one on top of the other. In FIG. 4, the semiconductor chip 11 is fixed onto a stage 61 and the semiconductor chip 12 is fixed onto a stage 62. The external terminals of the semiconductor chips 11, 12 are connected to leads 64 with wires 63. The external terminal(s) of the semiconductor chip 11 and the external terminal(s) of the semiconductor chip 12 are also connected to each other with wires 65. The stages 61, 62, the semiconductor chips 11, 12, the wires 63, 65, and the leads 64 are encapsulated by an encapsulating material (e.g., encapsulating resin) 66 except for a portion of the leads 64.

The semiconductor chip 11 and the semiconductor chip 12 are separate chips. One reason that the semiconductor chip 11 and the semiconductor chip 12 are separate chips is because a leak current caused by failure (e.g., short-circuiting) of, for example, the AD converter 23 or the band gap reference voltage generation part 24 of the semiconductor chip 11 can be prevented from flowing to the semiconductor chip 12. Thereby, the semiconductor chip 12 can be prevented from being affected by the failure occurring in the semiconductor chip 11.

With the layered configuration of the semiconductors 11, 12 in FIG. 3, the stress applied to the semiconductor 11 and the stress applied to the semiconductor 12 can be substantially equal during the process of encapsulating the semiconductor chips 11, 12 with the encapsulating resin 54. Because the stress applied to the semiconductor chips 11, 12 affects the characteristics of the circuit elements constituting the semiconductor chips 11, 12, the characteristics of the AD converter 23 and the band gap reference voltage generation part 24 formed on the semiconductor chip 11 can be substantially the same as the characteristics of the AD converter 33 and the band gap reference voltage generation part 34 formed on the semiconductor chip 12. In other words, even in a case where the AD converter 23 and the band gap reference voltage generation part 24 of the semiconductor chip 11 are switched to the AD converter 33 and the band gap reference voltage generation part 34 of the semiconductor chip 12, there is hardly any change in the voltage measured with the battery voltage monitor circuit 10.

Further, the present invention is not limited to these embodiments, but variations and modifications may be made without departing from the scope of the present invention.

The present application is based on Japanese Priority Application No. 2012-050374 filed on Mar. 7, 2012, with the Japanese Patent Office, the entire contents of which are hereby incorporated by reference.

What is claimed is:

1. A battery voltage monitor circuit for monitoring a voltage of a plurality of secondary batteries, the battery voltage monitor circuit comprising:
    a first semiconductor chip; and
    a second semiconductor chip;
    wherein the first semiconductor chip includes
        a cell balance control part that enables a voltage of each of the plurality of secondary batteries to become constant, the cell balance control part being resistant to a first voltage,
        a level shift buffer part that outputs a battery voltage of one of the plurality of secondary batteries according to a command signal supplied from an external device, the level shift buffer part being resistant to the first voltage,
        a first logic circuit part that selects the one of the plurality of secondary batteries according to the command signal supplied from the external device, the first logic circuit part including a first storage part that retains a first reference value, the first logic circuit part being resistant to a second voltage lower than the first voltage, a first reference voltage generation part that generates a first reference voltage, the first reference voltage generating part being resistant to the second voltage, a first AD conversion part that digitalizes a voltage of both ends of the first secondary battery into a first digital signal by using the first reference voltage, the first AD conversion part being resistant to the second voltage, and a first communication part that transmits the first digital signal to the external device, the first communication part being resistant to the second voltage, wherein the second semiconductor chip includes a second logic circuit part that selects the one of the plurality of secondary batteries according to the command signal supplied from the external device, the second logic circuit part including a second storage part that retains a second reference value, the second logic circuit part being resistant to the second voltage, a second reference voltage generation part that generates a second reference voltage, the second reference voltage generating part being resistant to the second voltage, a second AD conversion part that digitalizes a voltage of both ends of the second secondary battery into a second digital signal by referring to the second reference voltage, the second AD conversion part being resistant to the second voltage, and a second communication part that transmits the second digital signal to the external device, the first communication part being resistant to the second voltage, wherein the first logic circuit part is configured to perform a first diagnosis for determining whether the first AD conversion part and the first reference voltage generation part are normal, the first diagnosis being performed by selecting a voltage of a first predetermined part according to the command signal supplied from the external device and comparing the voltage of the first predetermined part digitalized by the first AD conversion part with respect to the first reference value retained in the first storage part, wherein in a case where a determination result of the first diagnosis is normal, the first AD conversion part is configured to digitalize the voltage of both ends of the one of the plurality of secondary batteries into a first digital signal and output the first digital signal, wherein in a case where a determination result of the first diagnosis is not normal, the second logic circuit part is configured to perform a second diagnosis for determining whether the second AD conversion part and the second reference voltage generation part are normal, the second diagnosis being performed by selecting a voltage of a second predetermined part according to the command signal supplied from the external device and comparing the voltage of the second predetermined part digitalized by the second AD conversion part with respect to the second reference value retained in the second storage part, wherein in a case where a determination result of the second diagnosis is normal, the second AD conversion part is configured to digitalize the voltage of both ends of the one of the plurality of secondary batteries into a second digital signal and output the second digital signal, and wherein in a case where a determination result of the second diagnosis is not normal, the battery voltage monitor circuit shuts down.

2. The battery voltage monitor circuit as claimed in claim 1, wherein the first and second semiconductor chips are formed one on top of the other and encapsulated by an encapsulating material.

3. The battery voltage monitor circuit as claimed in claim 1, wherein the first and second semiconductor chips are formed on a same plane and encapsulated by an encapsulating material.

4. The battery voltage monitor circuit as claimed in claim 1, wherein the plural secondary batteries are connected in series.

* * * * *